US005500645A

United States Patent [19]
Ribner et al.

[11] Patent Number: 5,500,645
[45] Date of Patent: Mar. 19, 1996

[54] ANALOG-TO-DIGITAL CONVERTERS USING MULTISTAGE BANDPASS DELTA SIGMA MODULATORS WITH ARBITRARY CENTER FREQUENCY

[75] Inventors: David B. Ribner; David H. K. Hoe, both of Schenectady, N.Y.

[73] Assignee: General Electric Company, Schenectady, N.Y.

[21] Appl. No.: 209,348

[22] Filed: Mar. 14, 1994

[51] Int. Cl.$^6$ .............................. H03M 1/06; H03M 3/00
[52] U.S. Cl. ........................................... 341/143; 341/118
[58] Field of Search ...................... 341/143, 118

[56] References Cited

U.S. PATENT DOCUMENTS

| | | | |
|---|---|---|---|
| 5,084,702 | 1/1992 | Ribner | 341/143 |
| 5,103,229 | 4/1992 | Ribner | 341/143 |
| 5,153,593 | 10/1992 | Walden et al. | 341/143 |
| 5,283,578 | 2/1994 | Ribner et al. | 341/143 |
| 5,414,424 | 5/1995 | Cabler | 341/143 |

OTHER PUBLICATIONS

R. Schreier et al., "Bandpass Sigma Delta Modulation", Electronics Letters, vol. 25, No. 23, 9th Nov. 1989, pp. 1560–1561.
Z. X. Zhang et al., "Bandpass A/D Converter Using Two-path Multibit Structure", Electronics Letters, vol. 27, No. 22, 24th Oct. 1991, pp. 2008–2009.
R. Schreier et al., "Multibit Bandpass Delta–Sigma Modulations Using N–Path Structures", IEEE International Symposium on Circuits and Systems, May 1992, pp. 593–596.
D. B. Ribner, "A Comparison of Modulator Networks for High–Order Oversampled Sigma–Delta Analog–to–Digital Converters", IEEE Trans. on Circuits and Systems, vol. CAS-38, No. 2, pp. 145–159, Feb. 1991.
D. B. Ribner, R. D. Baertsch, S. L. Garverick, D. T. McGrath, J. E. Krisciunas, T. Fujii, "A Third–Order Multistage Sigma–Delta Modulator with Reduced Sensitivity to Nonidealities", IEEE Journal of Solid–State Circuits, vol. 26, No. 12, Dec. 1991, pp. 1764–1774.

Primary Examiner—A. D. Pellinen
Assistant Examiner—Jason Kost
Attorney, Agent, or Firm—Marvin Snyder

[57] ABSTRACT

An architecture for oversampled delta-sigma ($\Delta$—$\Sigma$) analog-to-digital (A/D) conversion of high-frequency, narrow-band signals includes multistage $\Delta$—$\Sigma$ modulators that incorporate band-reject noise shaping centered at an arbitrary center frequency $F_{bp}$. These modulators cascaded with a bandpass digital filter centered at the arbitrary center frequency $F_{bp}$ perform A/D conversion for high-frequency, narrow-band signals having the same arbitrary frequency. The bandpass modulators are implemented by use of resonators which provide a substantially large gain at the arbitrary frequency.

14 Claims, 9 Drawing Sheets

1

ANALOG-TO-DIGITAL CONVERTERS USING MULTISTAGE BANDPASS DELTA SIGMA MODULATORS WITH ARBITRARY CENTER FREQUENCY

BACKGROUND OF THE INVENTION

This invention relates in general to analog-to-digital (A/D) converters and, more particularly, to a new architecture for oversampled delta-sigma (Δ—Σ) A/D conversion of high frequency, narrow band signals using cascaded low order stages with an arbitrary center frequency to obtain high overall order of noise shaping.

Single-loop bandpass delta-sigma (Δ—Σ) modulation is described by R. Schreier and M. Snelgrove in "Bandpass Sigma Delta Modulation," *Electronics Letters*, Vol. 25, Nov. 9, 1989, pp. 1560–1561. Z. X. Zhang, G. C. Temes and Z. Czarnul in "Bandpass ΔΣ A/D Converter Using Two-Path Multibit Structure", *Electronics Letters*, Vol. 27, Oct. 24, 1991, pp. 2008–2009, citing Schreier et al., supra, describe a modification of the basic structure using N-path switched capacitor circuits. Subsequently, R. Schreier, G. C. Temes, A. G. Yesilyurt, Z. X. Zhang, Z. Czarnul, and A. Hairapetian in "Multibit Bandpass Delta-Sigma Modulators Using N-Path Structures", *IEEE International Symposium on Circuits and Systems*, May 1992, pp. 593–596, describe simulation results of two switched-capacitor circuits for use in a multi-bit bandpass sigma-delta modulator.

Typically, cascaded low-order delta-sigma stages have been used to implement higher order delta-sigma modulators for A/D conversion of low-pass signals. See, for example, D. B. Ribner, "A Comparison of Modulator Networks for High-Order Oversampled Sigma-Delta Analog-to-Digital Converters," *IEEE Trans. Circuits and Systems*, Vol. CAS-38, No. 2, pp. 145–159, Feb. 1991. Those cascades comprise combinations of first and second-order individual stages and thereby avoid the stability problem prone to single-loop modulators of third-order and higher. See also D. B. Ribner U.S. Pat. Nos. 5,084,702, 5,103,229, and 5,148,166, all assigned to the present assignee, for further background on plural-order sigma-delta analog-to-digital converters. U.S. Pat. Nos. 5,084,702, 5,103,229 and 5,148,166 are hereby incorporated by reference.

U.S. Pat. No. 5,283,578, issued Feb. 1, 1994, by D. B. Ribner and D. H. K. Hoe, assigned to the present assignee and herein incorporated by reference, provides an architecture for multistage delta-sigma (Δ—Σ) bandpass modulators that provide band-reject noise shaping at one fourth the sampling frequency $F_s$. Although the foregoing multistage architecture, advantageously overcomes many of the problems of previous single stage high order architectures, such as stability, component spread and design complexity, the center frequency of the bandpass modulators therein is limited to one fourth of the sampling frequency $F_s$.

SUMMARY OF THE INVENTION

It is therefore an object of the present invention to provide a new architecture for oversampled delta-sigma (Δ—Σ) analog-to-digital (A/D) conversion of high-frequency, narrow-band signals which is not limited to a single center frequency.

Briefly, in accordance with a preferred embodiment of the invention, an architecture for multistage delta-sigma (Δ—Σ) bandpass modulators having an arbitrary bandpass frequency $F_{bp}$ situated below at least one half of the sampling frequency Fs is provided. The bandpass modulators of the present invention may be implemented with a resonator having z domain transfer function $$H_R(z) = \frac{z^{-1}}{1 - 2\cos\theta z^{-1} + z^{-2}}$$

which when cascaded with a bandpass digital filter centered at the arbitrary center frequency $F_{bp}$ can perform A/D conversion for high-frequency, narrow-band signals centered at the same arbitrary frequency. In the above equations, z is the discrete time frequency variable. As used herein θ is an arbitrary phase angle defined by $$\theta = 2\pi \frac{F_{bp}}{F_s}.$$

BRIEF DESCRIPTION OF THE DRAWINGS

The foregoing and other objects, aspects and advantages will be better understood from the following detailed description of the invention with reference to the accompanying drawings where like numerals represent like elements and in which.

DETAILED DESCRIPTION OF THE INVENTION

Figure 1:
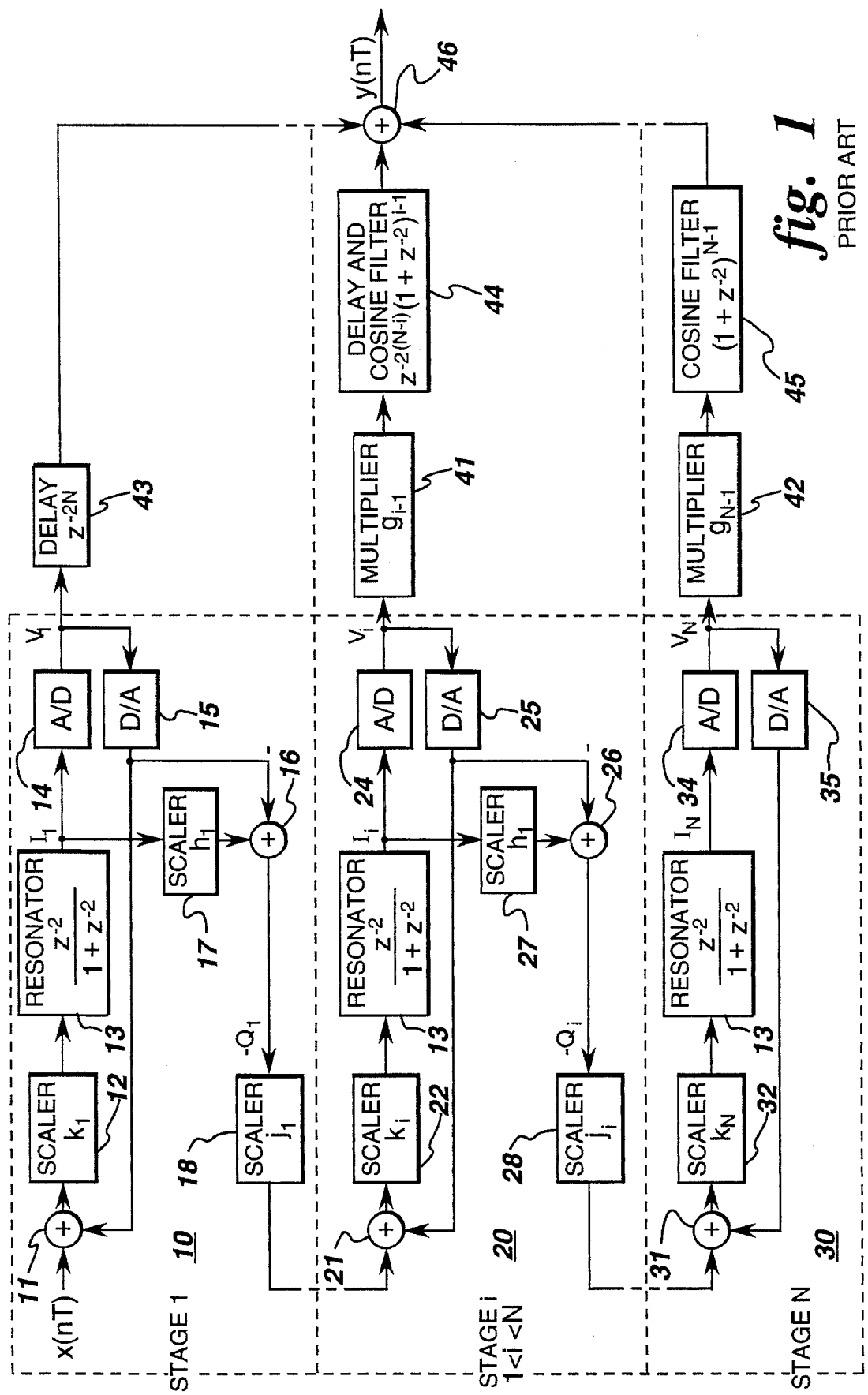
FIGS. 1 and 2 are block diagrams of respective architectures for band-pass multistage Δ—Σ A/D converters which operator a single center frequency.
Figure 2:
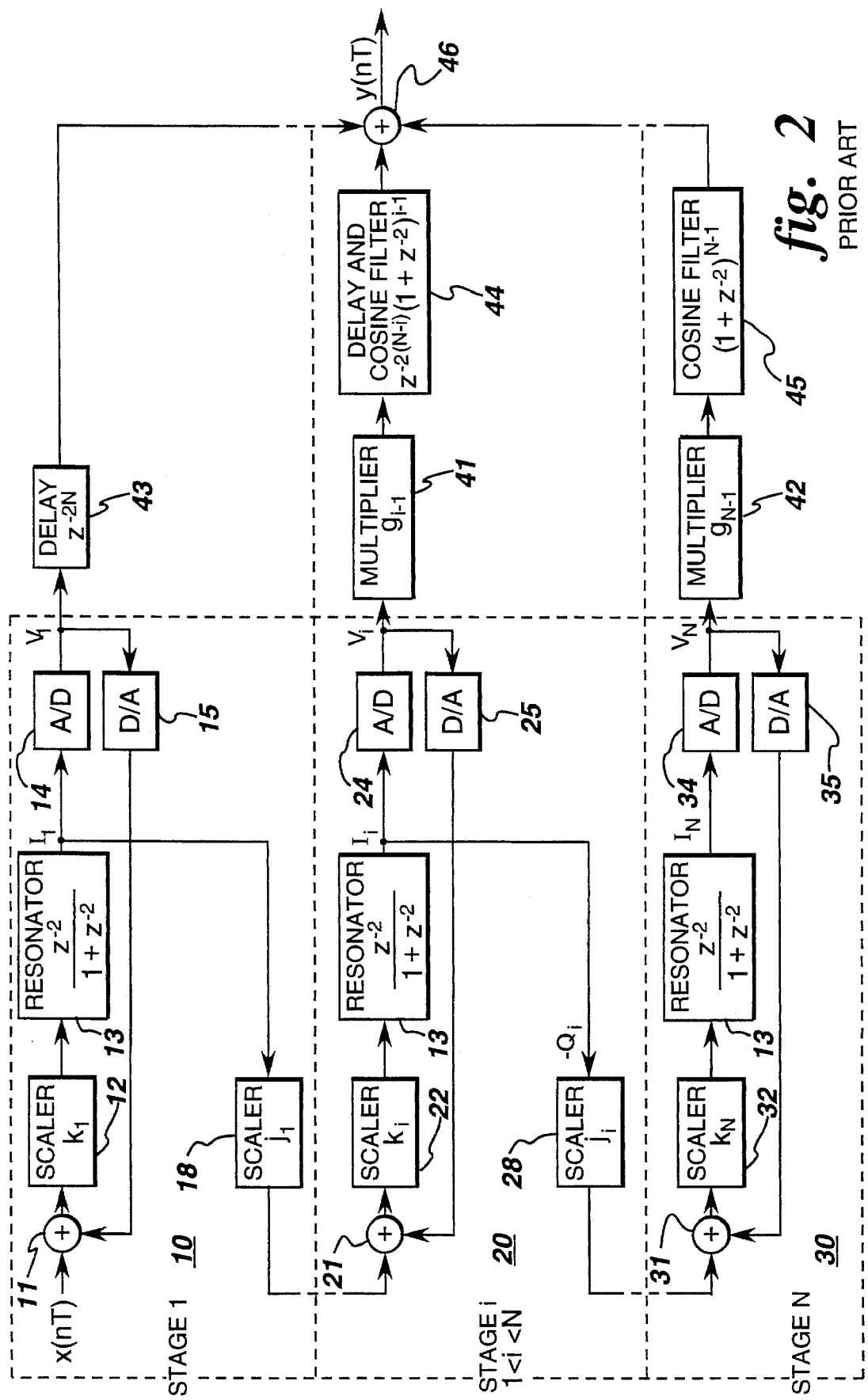

FIGS. 1 and 2 illustrate examples of band-pass modulators having a center frequency limited to one fourth of the sampling frequency $F_s$. More particularly, FIG. 1 illustrates a Multiple Second-Order Cascade (MSOC) modulator that is capable of cosinusoidal noise shaping of order 2N so as to suppress quantization noise about the aforementioned center frequency. The MSOC modulator generates a sampled-data digital response y(nT) to a sampled-data input voltage x(nT), which response is supplied to a decimation filter (not shown) that provides the ultimate analog-to-digital (A/D) conversion result. The MSOC modulator is illustrated as having N stages, although such modulator typically is implemented with no more than three stages since mismatches and low gain cause leakage of lower order quantization noise to the output and thereby limit performance.

Stage 1, the first Δ—Σ stage 10, includes a two-input adder 11 to which the analog sampled-data input voltage x(nT) is supplied as an input signal to a first input of adder 11. Adder 11 is also supplied with a first analog feedback signal as the input signal to its second input. The resulting combined output signal from adder 11 constitutes a first error signal, which is scaled in a scaling element 12 by a scaling coefficient $k_1$ and then processed by a first resonator 13 to generate a resonator output voltage $I_1$. Specifically, as disclosed in U.S. Pat. No. 5,283,578, the resonator transfer function $$H_R(z) = \frac{z^{-2}}{1+z^{-2}} \quad (1)$$

provides an infinite gain at a frequency $F_s/4$ which allows the Δ—Σ modulator stage to have a center frequency corresponding to $F_s/4$. Integrator output voltage $I_1$ is digitized in an A/D converter 14 to generate, for the first Δ—Σ modulator stage 10, a digital output signal $V_1$ that corresponds to the sampled-data input signal x(nT). A digital-to-analog (D/A) converter 15 converts the A/D converter 14 output voltage $V_1$ into the aforementioned first analog feedback signal which is supplied to adder 11 as the input signal at its second input for completing the first feedback loop. The first analog feedback signal voltage from D/A converter 15 is also supplied to a first input of another two-input adder 16. Adder 16 receives at its second input the resonator output signal $I_1$ scaled by a scaling coefficient $h_1$ in a scaling element 17. Adder 16 generates a combined signal $-Q_1$ that corresponds to the negative of the quantization noise of the first Δ—Σ modulator stage 10 and, after scaling by a scaling coefficient $j_1$ of a scaling element 18, is used as an input signal for the second Δ—Σ modulator stage which, in the illustration, is ith Δ—Σ modulator stage 20.

The ith Δ—Σ modulator stage 20 includes a two-input adder 21 receiving at its first input, the scaled negative quantization noise of a preceding (i−1)th Δ—Σ modulator stage which, in the embodiment illustrated, is the first Δ—Σ modulator stage 10. Adder 21 is supplied with the analog feedback signal of the ith Δ—Σ modulator stage 20 as the input signal to its second input. The resulting combined output signal from adder 21 is the ith error signal, which is scaled in a scaling element 22 by a scaling coefficient $k_i$ and then processed by a resonator 23 to generate ith resonator output signal $I_i$. The resonator output signal $I_i$ is digitized in an A/D converter 24 to generate a digital output signal $V_i$ that corresponds to the negative of the scaled quantization noise of the preceding Δ—Σ modulator stage which, in the embodiment illustrated, is the first Δ—Σ modulator stage 10. A D/A converter 25 converts the A/D converter 24 output signal $V_i$ to an analog signal constituting the ith analog feedback signal supplied to adder 21 at its second input, completing the ith feedback loop. The ith analog feedback signal is also supplied to another two-input adder 26 at its first input. Adder 26 receives at its second input the ith integrator output signal $I_i$ scaled by a scaling element 27 with scaling coefficient $h_i$. Adder 26 generates a combined signal $-Q_i$ that corresponds to the negative of the quantization noise of the ith Δ—Σ modulator stage 20 and, after scaling by a scaling element 28 with scaling coefficient $j_i$, is used as an input signal voltage for the (i+1)th Δ—Σ modulator stage or, in the embodiment illustrated, Nth Δ—Σ modulator stage 30.

The Nth Δ—Σ modulator stage 30 includes a two-input adder 31 receiving at its first input, the negative of the scaled quantization noise of the preceding (N−1)th modulator stage or, in the embodiment illustrated, the ith Δ—Σ modulator stage 20. Adder 31 is supplied with the analog feedback signal of the Nth Δ—Σ modulator stage 30 at its second input. The resulting combined output signal from adder 31 is the Nth error signal, which is scaled in a scaling element 32 by a scaling coefficient $k_N$ and then processed by a resonator 33 to generate Nth resonator output signal $I_N$. The resonator output signal $I_N$ is digitized in an A/D converter 34 to generate a digital output signal $V_N$ that corresponds to the negative of the scaled quantization noise of the preceding Δ—Σ modulator or, in the embodiment illustrated, the ith Δ—Σ modulator 20. A D/A converter 35 converts the A/D converter 34 output signal $V_N$ to an analog signal as the Nth analog feedback signal which is supplied to adder 31 at its second input completing the Nth feedback loop.

The output signals of the ith and Nth Δ—Σ modulator stages 20 and 30 are scaled by multipliers 41 and 42, respectively, with scaling coefficients $g_{i-1}$ and $g_{N-1}$, respectively. The $V_1$ output signal of the first Δ—Σ modulator stage 10 is delayed by a delay element 43 to compensate for the delay in the $V_N$ output signal of the Nth Δ—Σ modulator stage 30. The $V_i$ output signal of the ith Δ—Σ modulator stage 20 is likewise delayed and additionally digitally filtered in a delay and cosine filter 44. Finally, the $V_N$ output signal of the Nth Δ—Σ modulator 30 is filtered in a cosine filter element 45. The output signals of elements 43, 44 and 45 are combined by a digital adder 46 to generate the digital output signal y(nT).

The type of Δ—Σ MSOC modulator shown in FIG. 1 uses the difference between A/D and D/A signals of each stage as the input signal to the following stage and is termed a quantization cascaded modulator, designated MSOC1. The scaling coefficients $g_i$, $h_i$, $j_i$, and $k_i$, where i=1 . . . N for this and the following prior art modulators of FIG. 2, are discussed in the Ribner paper, supra. In FIG. 1, however, $$g_{i-1} = \frac{1}{j_1 j_2 \ldots j_{i-1}}$$

for stage i, and $$g_{N-1} = \frac{1}{j_1 j_2 \ldots j_{N-1}}$$

for stage N, while $h_i=1/k_i$ for stage i, (where i=1 . . . N), where $k_1$ through $k_N$ are arbitrary coefficients, typically equal to or less than unity. For example, such k coefficients are typically equal to unity if respective multi-bit A/D and D/A converters are used. However, it is generally preferred to use respective one-bit A/D and D/A converters so as to obtain superior linearity in any given modulation stage, and in this case such k coefficients are usually less than unity without affecting the transfer function of any individual modulation stage. Similarly, $j_1$ through $j_{N-1}$ are also arbitrary and typically equal to unity. These coefficients are used for signal scaling.

FIG. 2 shows a Multiple Second Order Cascade modulator, designated MSOC2, which differs from the MSOC1 modulator shown in FIG. 1 in that the resonator output signal of a stage is taken directly as the input signal to the following stage; this is termed a resonator cascaded modulator. Again, practical implementations have been limited to three stages or less due to matching and finite gain constraints. In FIG. 2, $$g_{i-1} = \frac{1}{j_1 j_2 \ldots j_{i-1} k_1 k_2 \ldots k_{i-1}},$$

for stage i $$g_{N-1} = \frac{1}{j_1 j_2 \ldots j_{N-1} k_1 k_2 \ldots k_{N-1}}$$

for stage N, and $k_1$ through $k_N$ are arbitrary coefficients and typically equal to or less than unity, while $j_1$ through $j_{N-1}$ are also arbitrary and typically equal to unity, as discussed in the context of FIG. 1.

The multistage modulators shown in FIGS. 1 and 2 use digital networks to combine the individual output signals from the multiple stages into a single output signal that is supplied to the input of a subsequent digital decimation filter (not shown). In each case, the resulting output signal from any of these modulators is of the form $$Y(z)=z^{-2N}X(z)+g_{N-1}(1+z^{-2})^N Q_N(z) \quad (2)$$

for MSOC1 and MSOC2, where $Q_N$ is the quantization noise of stage N.

Figure 3:
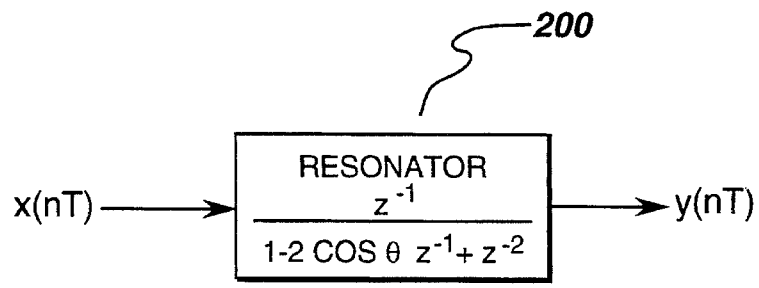
FIG. 3 is a functional block diagram of the discrete time resonator employed in the present invention.

Bandpass modulators of the present invention may be implemented by utilizing a resonator 200, as shown in FIG. 3, instead of the resonator of the type shown in FIGS. 1 and 2. Specifically, instead of employing the z domain transfer function $$\frac{z^{-2}}{1+z^{-2}}, \quad (3)$$

the following resonator transfer function $$H_R(z) = \frac{z^{-1}}{1 - 2\cos\theta z^{-1} + z^{-2}} \quad (4)$$

is employed. The transfer function of Eq. 4 differs from the transfer function of Eq. 3 in that the pair of complex conjugate poles at $z=e^{\pm j\pi}/2$ is advantageously transformed to a pair of complex conjugate poles at $z=e^{\pm j\theta}$. Thus the original resonator with infinite DC gain at a single frequency of $F_s/4$ is replaced by a resonator with infinite gain at an arbitrary frequency $F_{bp}$, preferably situated at least one half below the sampling frequency $F_s$ in order to satisfy the Nyquist sampling rate requirement. As used herein $\theta=2\pi F_{bp}/F_s$.

Figure 4:
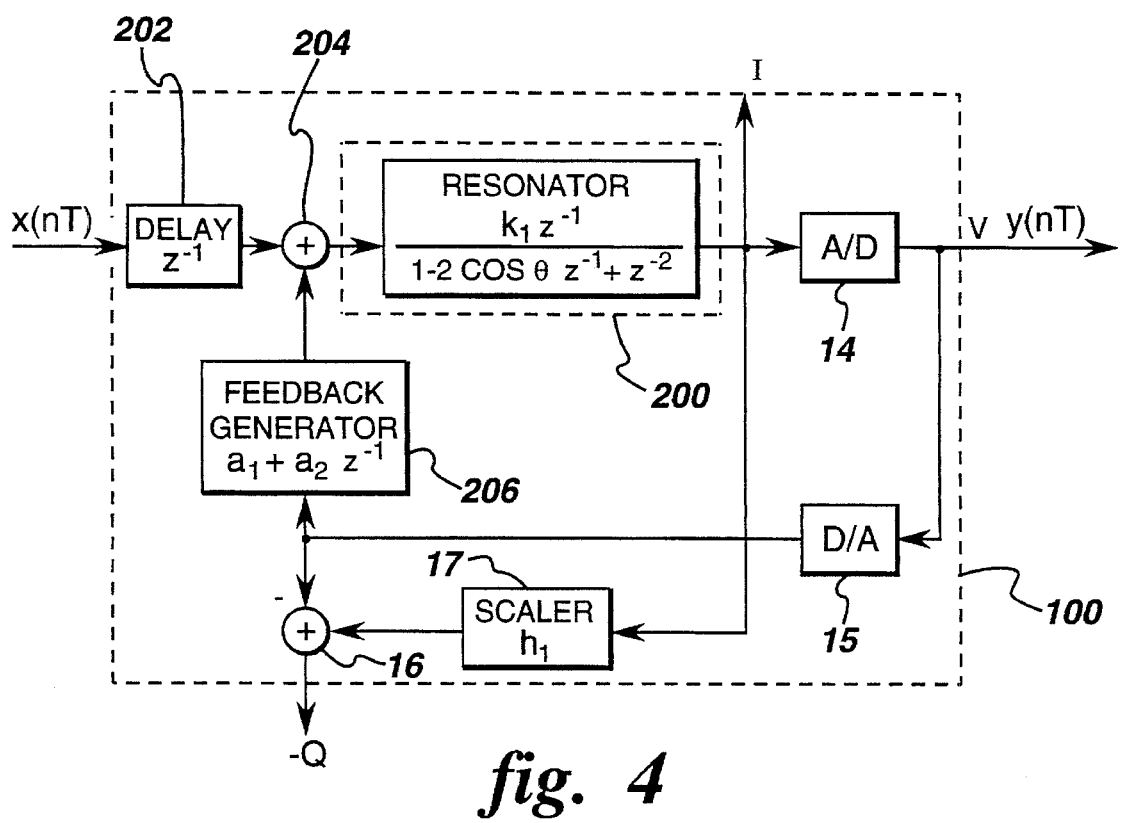
FIG. 4 is a block diagram of one stage of a band-pass Δ—Σ A/D converter in accordance with the present invention.

The above transformation may be illustrated by the modulation stage representation of FIG. 4. Specifically, a $\Delta$—$\Sigma$ modulator stage 100 which has an arbitrary center frequency $F_{bp}$ can be implemented when the input signal, e.g., x(nT), is supplied to an input delay unit 202 to generate a delayed analog input signal. A two-input adder 204 whose output is coupled to resonator 200 receives the delayed analog input signal at its first input and a suitable feedback analog signal at its second input. Resonator 200 as illustrated in FIG. 4, includes a scaling coefficient $k_1$, usually less than unity, without affecting the overall characteristics of resonator 200 illustrated in FIG. 3 with scaling equal to unity. The feedback signal supplied to adder 204 is generated in feedback generator 206, as will be explained shortly hereafter, in response to the output signal of D/A converter 15 which is coupled to A/D converter 14 and which in turn receives the output signal of resonator 200.

Figure 5A:
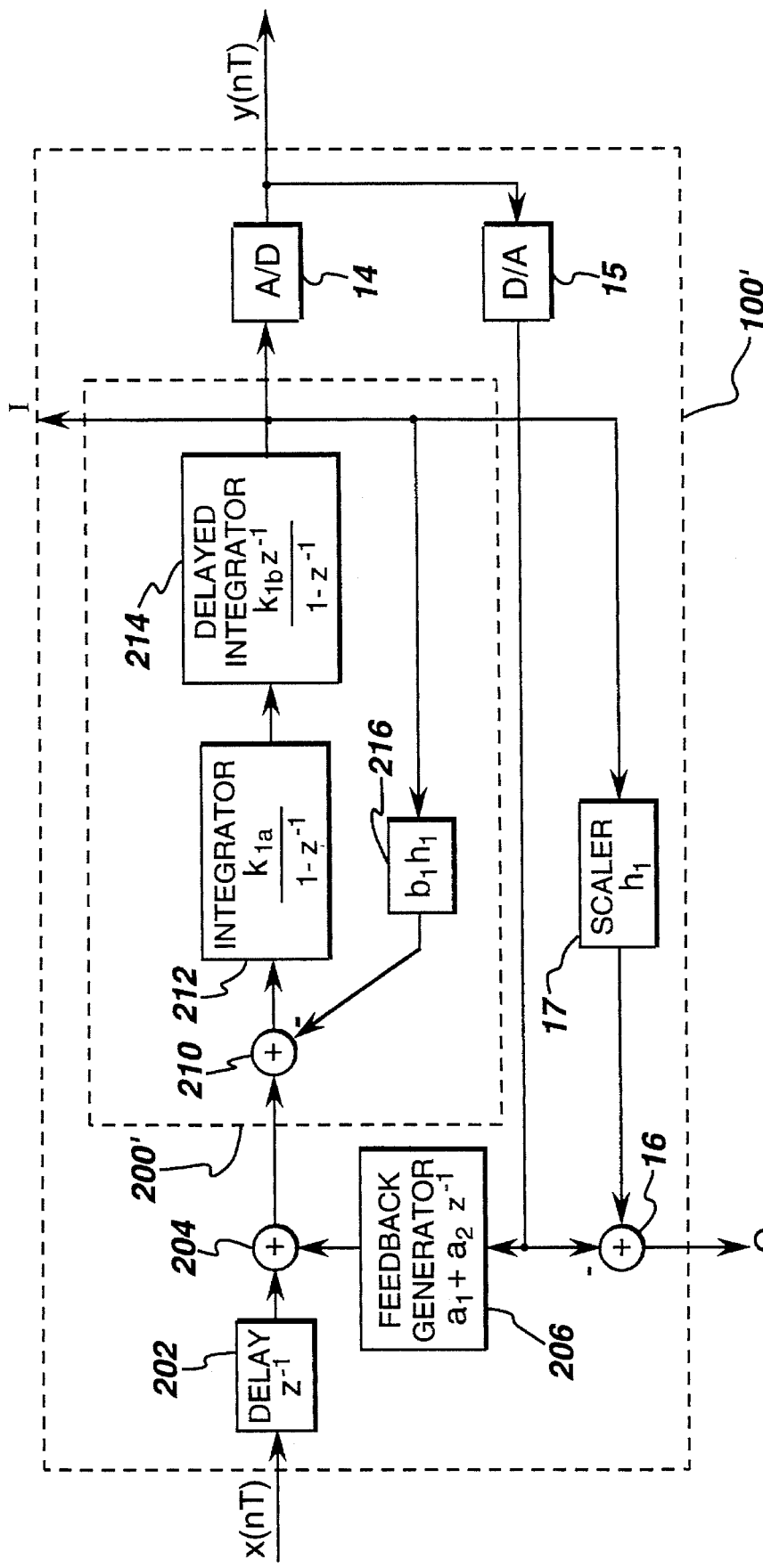
FIG. 5A is a block diagram in a modulation stage of a resonator employing integrators according to one aspect of the invention.

One modulation stage 100' implementation using a resonator constructed with basic integrating units in accordance with one aspect of the invention is illustrated in FIG. 5A. In particular, resonator 200' includes an analog subtracter 210 which receives a minuend input analog signal and a feedback subtrahend signal for producing a difference output signal. An integrator 212 receives the difference output signal to generate a first integrated output signal in response thereto. A delayed integrator 214 delays and integrates the first integrated output signal to generate a second integrated output signal in response thereto. The second integrated output signal is the output signal of resonator 200'. For the embodiments shown in FIGS. 4 and 5A the k scaling coefficients can be conveniently selected such that $h_1=1/k_1$ (FIG. 4) or $h_1=1/k_{1a}k_{1b}$ (FIG. 5). In each case, as suggested in the context of FIGS. 1 and 2, such k coefficients cooperate to provide an overall scaling coefficient which can be equal to or less than unity depending on the particular modulation stage design. In contrast, the following coefficients are specifically chosen such that $a_1=-k_1 2\cos\theta$; $a_2=k_1$; and $b_1=2(1-\cos\theta)$ so as to provide suitable scaling regardless of the value of the arbitrary bandpass frequency at which the $\Delta$—93 modulator stage is operated. Further, it will be appreciated from FIGS. 4 and 5A that feedback generator 206 comprises, by way of example and not of limitation, both a scaling unit and a delay unit which cooperate to generate the analog feedback signal supplied to the second input of adder 204.

Figure 5B:
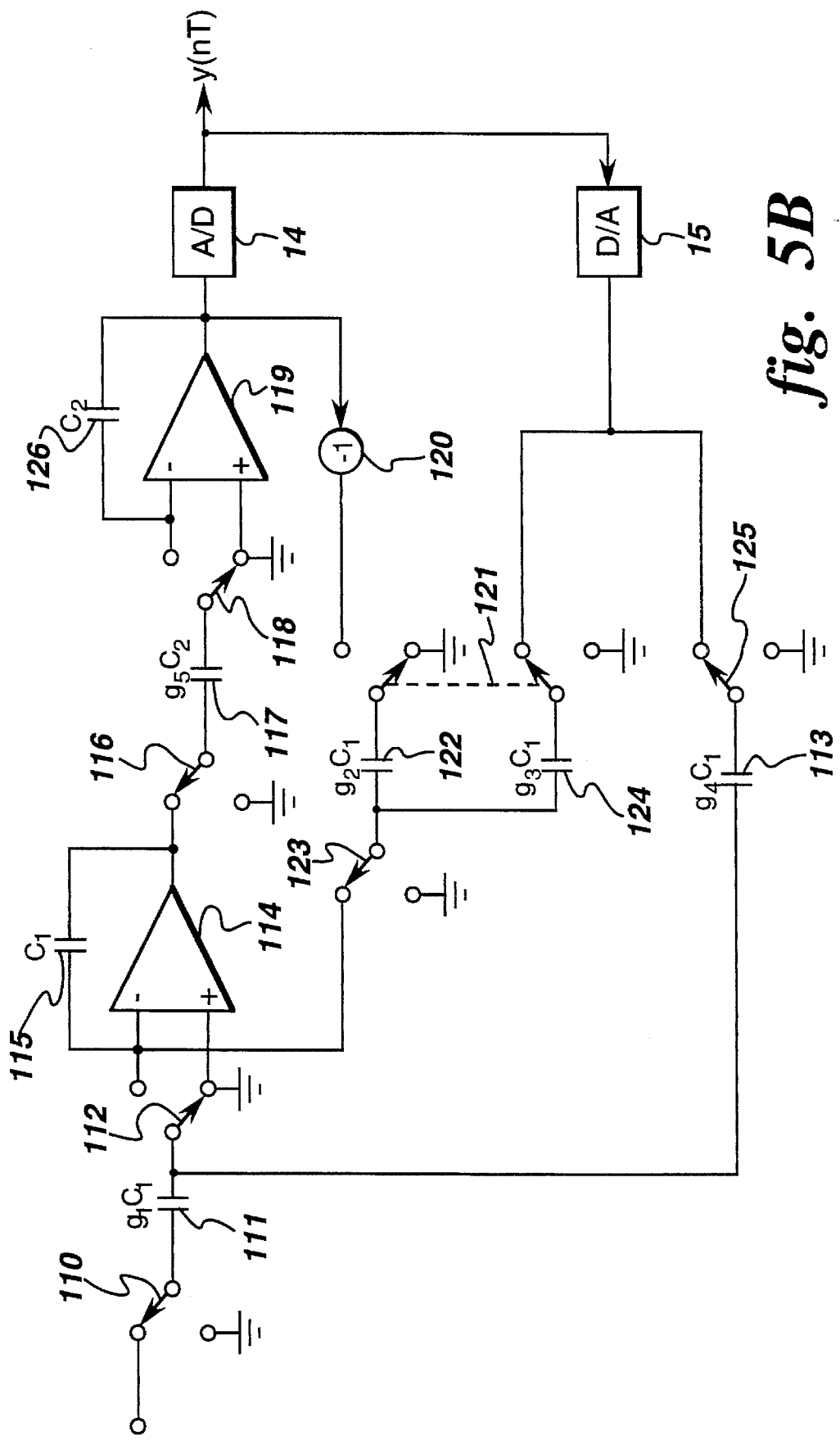
FIG. 5B is a schematic diagram of a switched-capacitor implementation of the circuitry of FIG. 5A.

A practical implementation for the modulation stage of FIG. 5A employs switched capacitor (SC) integrators, as shown in FIG. 5B. In particular, the analog sampled-data input voltage, e.g., x(nT), is supplied to one pole of a single-pole, double throw (SPDT) sampling switch 110. This switch in practice is implemented with semiconductor switching devices but, for simplicity of illustration, is shown as a mechanical switch. The analog sampled-data input voltage x(nT) is supplied by switch 110 to a capacitor 111 having a capacitance value $g_1 C_1$ to charge capacitor 111 to the input voltage level during a first switching period when the other side of capacitor 111 is connected by SPDT switch 112 to ground. Also during the first switching period, switch 112 connects a capacitor 113 to ground. Switch 112, like switch 110 or any of the switches illustrated in FIG. 5B, is preferably implemented with a suitable semiconductor switching device. During a second switching period, switches 110 and 112 reverse the positions shown in FIG. 5B so that the respective electrical charges in capacitors 111 and 113 are summed and applied to the inverting input of an operational amplifier 114. Operational amplifier 114 is configured as an integrator with a feedback capacitor 115 having a capacitance value $C_1$ coupled between its output and its inverting input. The output signal of operational amplifier 114 is supplied to one pole of a SPDT sampling switch 116. The integrated output voltage of operational amplifier 115 is supplied by switch 116 to a capacitor 117 having a capacitance value $_{g5}C_2$ to charge capacitor 117 to the integrated output voltage during the first switching period when the other side of capacitor 117 is connected by a SPDT switch 118 to ground. During the second switching period, switches 116 and 118 reverse the positions shown in FIG. 5B so that the electrical charge in capacitor 117 is applied to the inverting input of an operational-amplifier 119. Operational amplifier 119 is also configured as an integrator with a feedback capacitor 126 having a capacitance value $C_2$ coupled between its output and its inverting input. The output signal of operational amplifier 119 is supplied from an inverter 120 to one pole of a double-pole, double throw (DPDT) switch 121 which in the second switching period is connected to a capacitor 122 having a capacitance value $_{g2}C_1$ to charge capacitor 122 to the input voltage level during the second switching period when the other side of capacitor 122 is connected by a SPDT switch 123 to ground. During the first switching period any electrical charge in capacitor 122 is supplied to the inverting terminal of operational amplifier 114 thus completing the feedback path internal to resonator 200' as shown in FIG. 5A. The output signal of operational amplifier 119 is also supplied to A/D converter 14 and then to D/A converter 15 such that the output of D/A converter 14 is supplied to the other pole of switch 121. During the first switching period, any charge in a capacitor 124 having a capacitance value of $_{g3}C_1$ is directly supplied to the inverting terminal of operational amplifier 114 thereby providing the scaled signal supplied by the scaling unit of feedback generator 206, as shown in FIG. 5A. During the first switching period, the output signal of D/A converter 15 also charges capacitor 113 when the other side of capacitor 113 is connected to ground. During the second switching period, the electrical charge in capacitor 113 is supplied to the inverting terminal of operational amplifier 114 thereby providing the signal corresponding to the delayed signal by the delay unit in feedback generator 206, as shown in FIG. 5A. The following capacitance ratios make the SC circuit implementation of FIG. 5B fully consistent with the embodiment of FIG. 5A $g_1 g_5 = k_1;$ $g_2 g_5 = 2(1 - Cos\theta);$ $g_4 g_5 = k_1;$ and $g_3 g_5 = 2k_1 Cos\theta$ and wherein $k_1 = k_{1a} k_{1b}$.

Although FIG. 5B illustrates, by way of example and not of limitation, a single-ended circuit, a fully differential implementation capable of operating in a mode suitable for handling differential signals is generally preferred in actual practice due to its improved power supply noise immunity and rejection of even-order nonlinearities. An example of such fully differential implementation is described by D. B. Ribner, et al in "A third-Order Multistage Sigma-Delta Modulator with Reduced Sensitivity to Nonlinearities", IEEE, Journal of Solid State Circuits, Vol. 26, No. 12, Dec., 1991, pp. 1764–1773, which is herein incorporated by reference. In a fully differential implementation, inverter 120 is simply implemented by reversal of the balanced signal path.

Figure 6A:
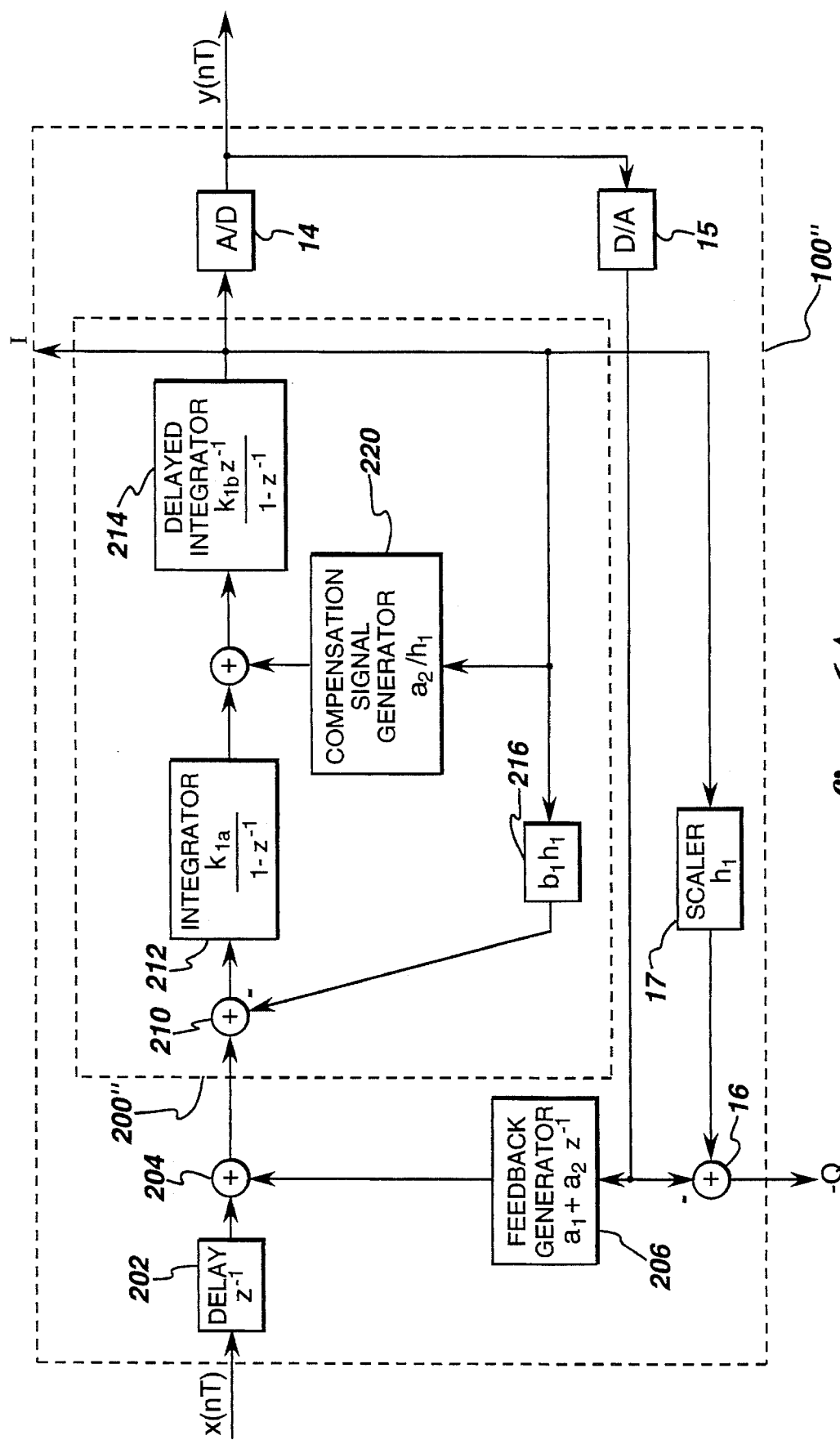
FIG. 6A is a block diagram in a modulation stage of a resonator employing integrators according to another aspect of the invention.

Another modulation stage 100" implementation using a resonator constructed with basic integrating units in accordance with another aspect of the invention is illustrated in FIG. 6A. Like resonator 200' of FIG. 5A, resonator 200" includes an analog subtracter 210 which receives a minuend input analog signal and a feedback subtrahend signal for producing a difference output signal. An integrator 212 receives the difference output signal to generate a first integrated output signal in response thereto. Unlike resonator 200' of FIG. 5A, resonator 200" includes a two-input adder 218 for receiving the first integrated output signal as an input signal to its first input and for receiving at its second input a compensation signal for producing a combined output signal which is produced in a compensation signal generator 220 in response to the output signal from D/A converter 15. Delayed integrator 214 delays and integrates the combined output signal to generate a second integrated output signal in response thereto. The second integrated output signal is the output signal of resonator 200". For the embodiment shown in FIG. 6A the scaling coefficients can be selected such that $h_1 = 1/k_{1a} k_{1b}$; $a_1 = 1 - 2Cos\theta$; $a_2 = -2Cos\theta$ and $b_1 = 2(1 - Cos\theta)$ so as to provide suitable scaling regardless of the value of the arbitrary bandpass frequency at which the $\Delta - \Sigma$ modulator stage is operated. It is noted that feedback generator 206 used in the embodiment of FIG. 6A comprises only a unit delay path whereas feedback generator 206 used in the embodiment of FIG. 5A comprises a combined path made up of a unit delay path and a nondelayed path. In each case, the overall response is consistent with a resonator as depicted in FIG. 3 which allows for implementation of delta-sigma ($\Delta - \Sigma$) bandpass modulators having an arbitrary bandpass frequency $F_{bp}$.

Figure 6B:
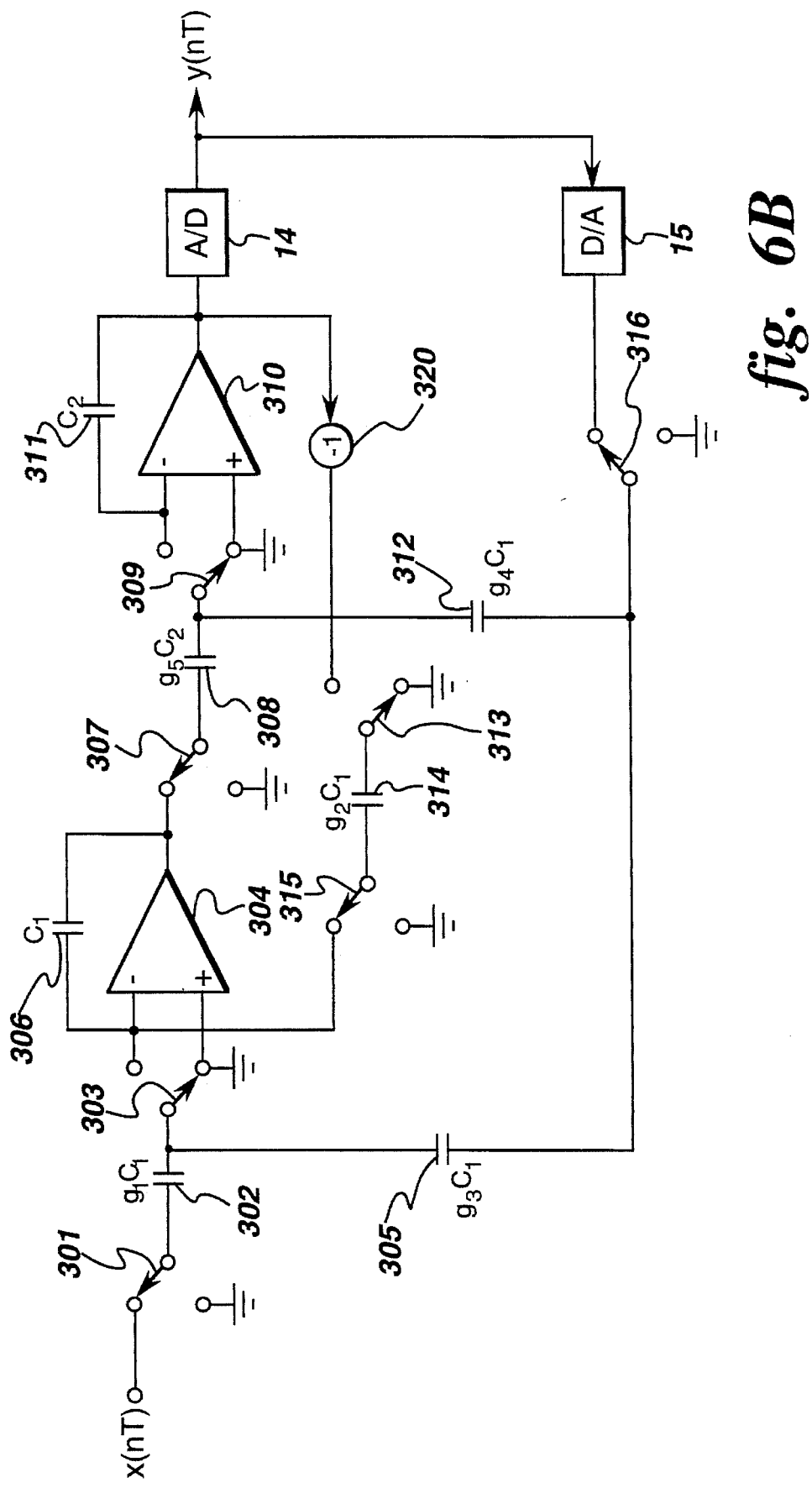
FIG. 6B is a schematic diagram of a switched-capacitor implementation of the circuitry of FIG. 6A.

A practical implementation for the modulation stage of FIG. 6A employs switched capacitor (SC) integrators as shown in FIGS. 6B. In particular, the analog sampled-data input voltage (e.g., x(nT)) is supplied to one pole of a single-pole, double throw (SPDT) sampling switch 301. This switch in practice is implemented with semiconductor switching devices, but for simplicity of illustration, is shown as a mechanical switch. The analog sampled-data input voltage x(nT) is supplied by switch 301 to a capacitor 302 having a capacitance value $_{g1}C_1$ to charge capacitor 302 to the input voltage level during a first switching period when the other side of capacitor 302 is connected by SPDT switch 303 to ground. Also during the first switching period, switch 303 connects a capacitor 305 having a capacitance value of $_{g3}C_1$ to ground. Switch 303, like switch 110 or any of the switches illustrated in FIG. 6B, is preferably implemented with a suitable semiconductor switching device. During a second switching period, switches 301 and 303 reverse the positions shown in FIG. 6B so that the respective electrical charges on capacitors 302 and 305 are summed and applied to the inverting input of an operational amplifier 304. Operational amplifier 304 is configured as an integrator with a feedback capacitor 306 having a capacitance value $C_1$ coupled between its output and its inverting input. The output signal of operational amplifier 304 is supplied to one pole of a SPDT sampling switch 307. The integrated output voltage of operational amplifier 306 is supplied by switch 307 to a capacitor 308 having a capacitance value $_{g5}C_2$ to charge capacitor 308 to the integrated output voltage level during the first switching period when the other side of capacitor 308 is connected by a SPDT switch 309 to ground. Also during the first switching period, switch 309 connects a capacitor 312 having a capacitance value of $_{g4}C_2$ to ground. During a second switching period, switches 307 and 309 reverse the positions shown in FIG. 6B so that the respective electrical charges in capacitors 308 and 312 are summed and applied to the inverting input of an operational amplifier 310. Operational amplifier 310 is also configured as an integrator with a feedback capacitor 311 having a capacitance value $C_2$ coupled between its output and its inverting input. The output signal of operational amplifier 310 is supplied through an inverter 320 to one pole of a SPDT switch 313 which, in the second switching period, is connected to a capacitor 314 having a capacitance value $_{g2}C_1$ to charge capacitor 314 to the input voltage level during the second switching period when the other side of capacitor 314 is connected by a SPDT switch 315 to ground. During the first switching period any electrical charge in capacitor 314 is supplied to the inverting terminal of operational amplifier 304, thus completing the feedback path internal to resonator 200" as shown in FIG. 6A. The output signal of operational amplifier 310 is also supplied to A/D converter 14 and then to D/A converter 15. The analog output signal of D/A converter 15 is supplied to one pole of a SPDT switch 316. During the second switching period, any charge on capacitor 3 12 is supplied to the inverting terminal of operational amplifier 310, thereby providing the compensation signal supplied by compensation signal generator 220 shown in FIG. 6A. During the first switching period, the output signal of D/A converter 15 is also supplied to charge capacitor 305 when the other side of capacitor 305 is connected by switch 303 to ground. During the second switching period, the electrical charge on capacitor 305 is supplied to the inverting terminal of operational amplifier 304, thereby providing the sole delayed signal supplied by the unit delay in feedback generator 206 shown in FIG. 6A. The following capacitance ratios make the SC circuit implementation of FIG. 6B fully consistent with the embodiment of FIG. 6A:

$g1g5=k_1$;

$g2g5=2(1-Cos\theta)$;

$g3g5=k_1(1-2Cos\theta)$; and $g4=-2k_1 Cos\ \theta$ and wherein $k_1=k_{1a}k_{1b}$.

Although FIG. 6B illustrates a single-ended circuit, a fully differential implementation is preferably in practice, as suggested in the discussion of FIG. 5B.

Figure 7:
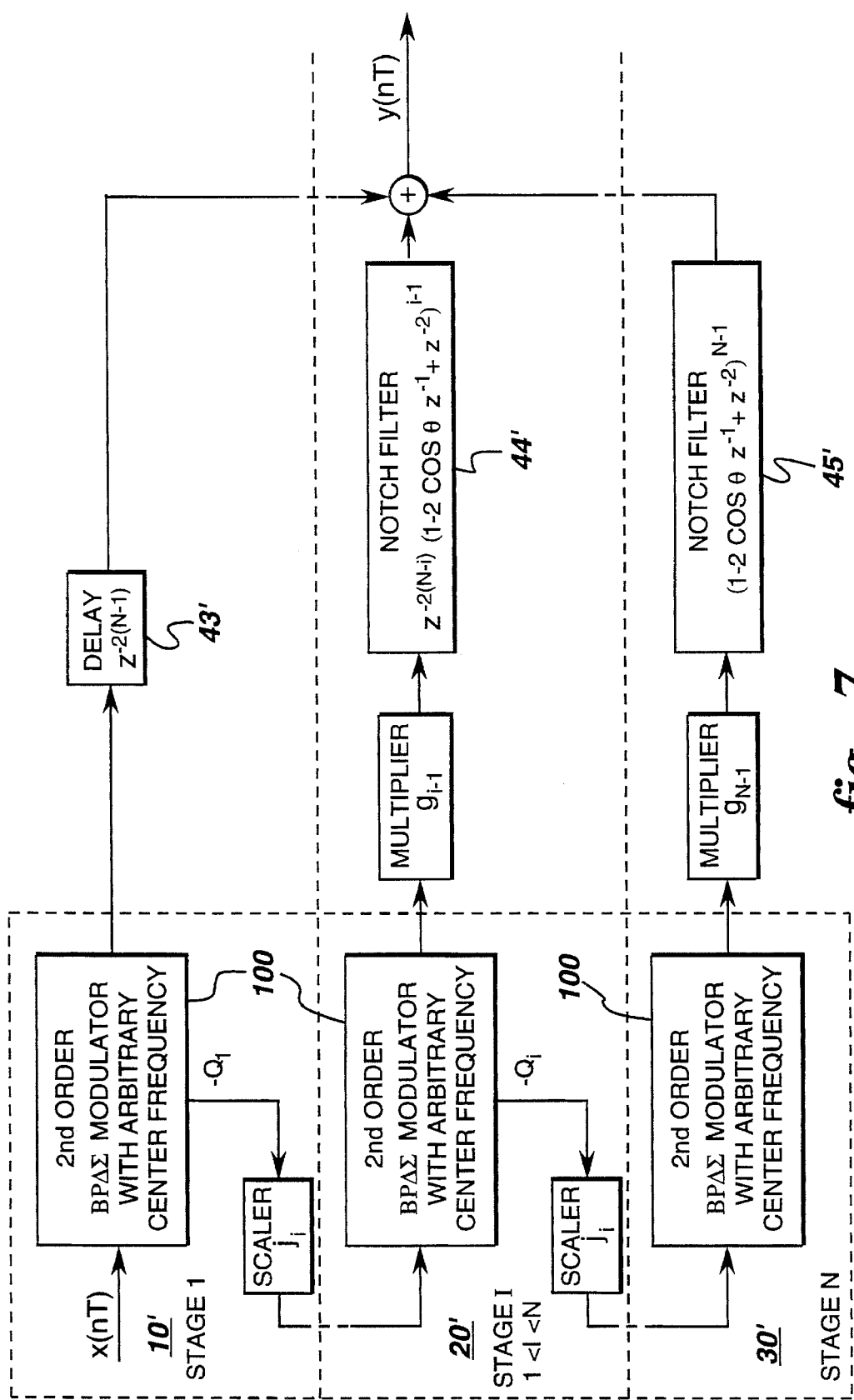
FIGS. 7 and 8 are block diagrams of a multistage Δ—Σ A-D converter implemented in accordance with the teachings of the present invention and based on the architectures shown in FIGS. 1 and 2, respectively.
Figure 8:
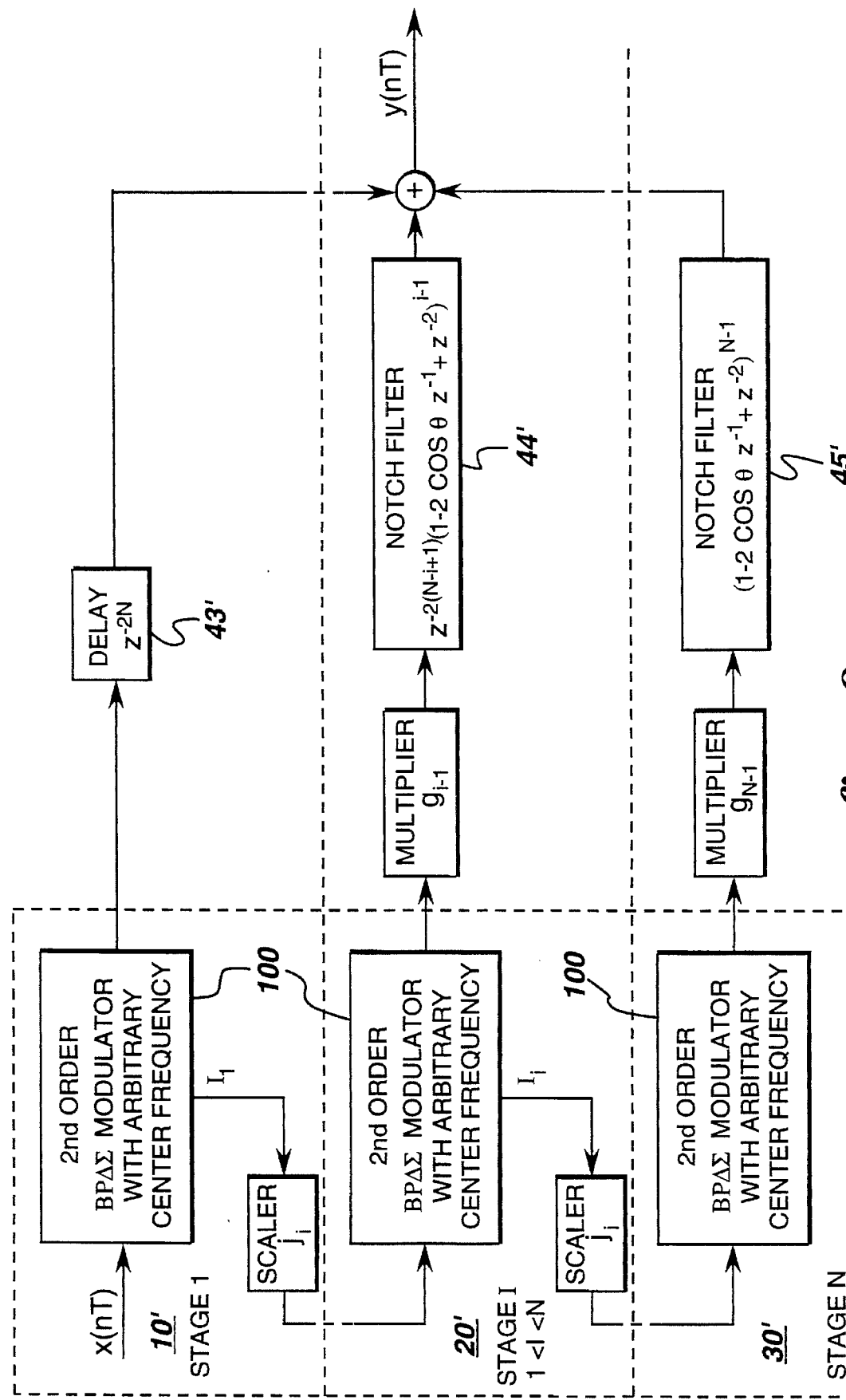

The new bandpass modulators of the invention, shown in FIGS. 7 and 8, are improvements over the prior art modulators of FIGS. 1 and 2, respectively. FIG. 7 shows a Multiple Second-Order Arbitrary Frequency Cascade modulator which is designated MSOAFC1 using an extension to the terminology introduced in the Ribner paper, supra, which is hereby incorporated by reference. The MSOAFC1 implementation uses quantization signals rather than resonator signals as input signals to successive stages, using the approach explained in the context of FIG. 1. The various g, h, j and k scaling coefficients in this modulator have the same values as the same respective coefficients in the modulator of FIG. 1. This modulator differs from the modulator of FIG. 1 in that it handles bandpass signals centered at an arbitrary frequency instead of bandpass signals at a single bandpass frequency and is therefore suitable for a wide array of applications. Comparing FIGS. 1 and 7, it will be noted that the bandpass modulator of FIG. 1 which has a bandpass limited to one fourth of the sampling frequency has been replaced with a bandpass modulator having an arbitrary center frequency and which may take the form of any of the embodiments shown in FIGS. 4 through 6. The $V_1$ output signal of the first stage 10' is delayed by a delay element 43' to compensate for the delay in the $V_N$ output signal of the Nth Δ—Σ modulator stage 30'. The $V_i$ output signal of the ith Δ—Σ modulator stage 20' is likewise delayed, and is additionally digitally filtered by a notch filter 44' with z domain transfer function $(1-2\cos\theta_z^{-2})^{i-1}$. The $V_N$ output signal of the Nth Δ—Σ modulator 30' is filtered by a notch filter with transfer function $(1-2\cos\theta_z^{-1}+z^{-2})^{N-1}$ in filter element 45'.

The Multiple Second-Order Arbitrary Frequency Cascade modulator designated MSOAFC2, shown in FIG. 8, employs integrator signal cascading using the approach explained in the context of FIG. 2. The various g, j and k scaling coefficients in the MSOAFC2 modulator of FIG. 8 have the same values as the same respective coefficients in the modulator of FIG. 2. Contrasting FIGS. 2 and 8, delay/cosine filter elements 44 of FIG. 2 have been replaced by delay/notch filter elements 44' and cosine filter element 45 of FIG. 2 has been replaced by notch filter 45' having the aforementioned transfer function.

The output equation for each of the new bandpass modulators is $$Y(z)=z^{-2N}x(z)+g_N(1-2\cos\theta_z^{-1}+z^{-2})^N Z_{N(z)}. \quad (5)$$

The corresponding magnitude noise transfer functions for each of the new bandpass modulators is $$|H_Q(e^{j\omega T})|=\left|\frac{Y(e^{j\omega T})}{Q_N(e^{j\omega T})}\right|=2^N|\cos(\omega t)-\cos\theta|^N. \quad (6)$$

One of the motivations for using cascaded modulators is that stability is insured if each stage is of order two or lower. Therefore, the MSOAFC1 and MSOAFC2 modulators are unconditionally stable since they are comprised of second-order stages. This is a significant advantage over prior art single-loop bandpass implementations in R. Schreier and M. Snelgrove, supra.

As to performance of the invention using conventional one micron CMOS (complementary metal-oxide-semiconductor) technology, it is expected that 16-bit A/D conversion of signals centered at 2.5 MHz with 150 kHz bandwidth is feasible, as is 12-bit conversion of signals centered at 10 MHz with 1.25 MHz bandwidth. Conventional A/D conversion in one micron CMOS is capable of only 16-bit and 12-bit resolution up to 80 kHz and 1 MHz signal frequencies, respectively.

While the invention has been described in terms of several preferred embodiments, those skilled in the art will recognize that the invention can be practiced with modification within the spirit and scope of the appended claims.

What is claimed is:

1. An improved oversampling delta-sigma analog-to-digital converter system for high-frequency, narrow-band signals, said system having a plurality of delta-sigma modulator stages having an arbitrary band-pass frequency $F_{bp}$ situated below at least one half of a sampling frequency Fs for providing respective digital output signals responsive to respective analog input signals, each of said modulator stages including an analog-to-digital converter and having a digital-to-analog converter in a feedback loop, said improved oversampling converter system comprising:

a resonator in each respective modulator stage situated to provide analog signals to said analog-to-digital converter in said stage and having a z transform transfer function $$\frac{z^{-1}}{1-2\cos\theta z^{-1}+z^{-2}}$$

wherein θ is a phase angle defined as $\theta=2\pi(F_{bp}/F_2)$; and means for combining the digital output signals of said plurality of delta-sigma modulator stages to suppress, in a resulting combined highly stable signal, quantization noise arising in at least one of said stages.

2. The improved oversampling delta-sigma analog-to-digital converter system of claim 1, further comprising:

means for applying an analog signal to be digitized by said improved oversampling delta-sigma analog-to-digital converter system as the analog input signal of a first one of said plurality of delta-sigma modulator stages; and quantization noise-producing means in each of said plurality of delta-sigma modulator stages except a final stage for determining the quantization noise of said delta-sigma modulator stages except the final stage, respectively, each said quantization noise-producing means being coupled to a subsequent one of said delta-sigma modulator stages, respectively, to provide an analog input signal thereto;

said digital-to-analog converter in each respective one of said plurality of delta-sigma modulator stages being coupled to receive output signals from said analog-to-digital converter.

3. The improved oversampling delta-sigma analog-to-digital converter system of claim 2 wherein said means for combining the digital output signals of said plurality of delta-sigma modulator stages comprises:

notch filter means having a z domain transfer function $$(1-2Cos\theta_z^{-1}+z^{-2})^{N-1}$$

for digitally filtering output signals of said means delta-sigma modulator stage, N being the total number of said delta-sigma modulator stages;

delay means for providing a compensating delay to the output signals of the first delta-sigma modulator stage; and means for combining output signals from said notch filter means and said delay means to produce an output signal for said oversampling delta-sigma analog-to-digital converter system.

4. The improved oversampling delta-sigma analog-to-digital converter system of claim 3 wherein said means for combining the digital output signals of said plurality of delta-sigma modulator stages further comprises additional notch filter means having a z domain transfer function $$(1-2Cos\theta_z^{-1}+z^{-2})^{N-2}$$

for digitally filtering output signals from the next-to-final delta-sigma modulator stage; and wherein said means for combining output signals from said notch filter means and said delay means also combines output signals of said additional notch filter means.

5. The improved oversampling delta-sigma analog-to-digital converter system of claim 1 wherein each respective one of said plurality of delta-sigma modulator stages comprises:

a two-input adder having its output coupled to said resonator therein;

an input delay unit for receiving the analog input signal therein and delaying said analog signal to generate a delayed analog input signal, said delayed analog input signal supplied as an input signal to a first input of said two-input adder therein, the input delay unit of a first delta-sigma modulator stage coupled to receive an analog signal which constitutes the analog signal therein to be digitized by said improved oversampling delta-sigma analog-to-digital converter system; and feedback generating means coupled to receive the output signal from said digital-to-analog converter therein and for generating a feedback signal for application to a second input of said two-input adder therein.

6. The improved oversampling delta-sigma analog-to-digital converter system of claim 5 further including;

means for coupling the output of the resonator of said first stage to an input delay unit of a second delta-sigma modulator stage; and means for coupling the output of the resonator of said second stage to an input delay unit of a third delta-sigma modulator stage.

7. The improved oversampling delta-sigma analog-to-digital converter system of claim 6 wherein said means for combining the digital output signals of said plurality of delta-sigma modulator stages comprises:

notch filter means having a z domain transfer function $$(1-2Cos\theta_z^{-1}+z^{-2})^2$$

for digitally filtering the output signal of said third delta-sigma modulator stage;

delay means for providing a compensating delay to the output signal of the first delta-sigma modulator stage; and means for combining output signals of said notch filter means and said delay means to produce an output signal for said oversampling delta-sigma analog-to-digital converter system.

8. The improved oversampling delta-sigma analog-to-digital converter system of claim 7 wherein said means for combining the digital output signals of said plurality of delta-sigma modulator stages further comprises additional notch filter means having a z domain transfer function $$1-2Cos\theta_z^{-1}+z^{-2}$$

for digitally filtering the output signal of the second delta-sigma modulator stage; and wherein said means for combining output signals of said notch filter means and said delay means also combines the output signal of said additional notch filter means.

9. The improved oversampling delta-sigma analog-to-digital converter system of claim 5 wherein said feedback generating means comprises a unit delay path.

10. The improved oversampling delta-sigma analog-to-digital converter system of claim 5 wherein said feedback generating means comprises a combined path having a unit delay path and a nondelayed path.

11. The improved oversampling delta-sigma analog-to-digital converter system of claim 1 wherein at least one of said resonators comprises:

an analog subtracter for receiving a minuend input analog signal and a feedback subtrahend signal and for producing a difference output signal;

an integrator for receiving said difference output signal and for generating a first integrated output signal in response thereto;

a delayed integrator for delaying and integrating said first integrated output signal to generate a second integrated output signal in response thereto, said second integrated output signal being the output signal of said one of said resonators; and means for generating said feedback subtrahend signal from said second integrated output signal.

12. The improved oversampling delta-sigma analog-to-digital converter system of claim 11 wherein said integrator receiving said difference output signal and said delayed integrator comprise respective switched capacitor integrators.

13. The improved oversampling delta-sigma analog-to-digital converter system of claim 1 wherein at least one of said resonators comprises:

an analog subtracter for receiving a minuend input analog signal and a feedback subtrahend signal for producing a difference output signal;

an integrator for receiving said difference output signal and for generating a first integrated output signal in response thereto;

a two-input adder for receiving said first integrated output signal at a first input and for receiving a compensation signal at a second input, for producing a combined output signal;

a delayed integrator for delaying and integrating said combined output signal and for generating a second integrated output signal in response thereto, said second integrated output signal being the output signal of said one of said resonators;

means for generating said feedback subtrahend signal from said second integrated output signal; and means for generating said compensation signal from the output signal of the digital-to-analog converter therein.

14. The improved oversampling delta-sigma analog-to-digital converter system of claim 13 wherein said integrator and delayed integrator comprise respective switched capacitor integrators.

* * * * *